United States Patent [19]

Garde

[11] Patent Number: 4,523,152

[45] Date of Patent: Jun. 11, 1985

[54] HIGH-EFFICIENCY FEEDFORWARD-ERROR-CORRECTION AMPLIFIER

[75] Inventor: Peter Garde, Bronte, Australia

[73] Assignee: Unisearch Limited, Kensington, Australia

[21] Appl. No.: 481,358

[22] Filed: Mar. 30, 1983

[30] Foreign Application Priority Data

Apr. 1, 1982 [AU] Australia ............... PF3424

[51] Int. Cl.³ ............................. H03F 21/00
[52] U.S. Cl. ............................. 330/151; 330/3
[58] Field of Search ............... 330/3, 149, 151, 10, 330/51

[56] References Cited

U.S. PATENT DOCUMENTS

| 3,399,358 | 8/1968 | Rinehart | 330/149 |
| 3,970,953 | 7/1976 | Walker et al. | 330/99 |
| 4,378,530 | 3/1983 | Garde | 330/297 |

FOREIGN PATENT DOCUMENTS 1055788 1/1967 United Kingdom.

OTHER PUBLICATIONS

Camenzind, H. R., "Modulated Pulse Audio Pwr. Amps. for ICs", IEEE Trans. Audio Electroacoust., vol. AV-14, pp. 136-140, 9/66.
Dutra, J. A., "Digital Amps. for Analog Pwr.", IEEE Trans. Consumer Electronics, vol. CE024, pp. 308-316, 8/78.
Spijkerman, J. J. and Sturgeon, C. L., "The Sturgeon Amp-A New Switch Tech.", Proc. Powercon 4, pp. H3—1-H3—3, 5/77.
Lipshitz, S. P., and Vanderkooy, J., "Feedforward Error Correction in Pwr. Amps.", J. Audio Eng. Soc., vol. 28, pp. 2-16, Jun./Feb. 1980.
Rensink, L. et al., "Design of a Kw Off-Line Switcher Using a Cuk Converter", Proc. Powercon 6, pp. H3—1-H3—26, 5/79.
Cuk, S., "A New Zero-Ripple Switching Dc-Dc Converter", IEEE Pwr. Elec. Specialists Conf., 1980, pp. 12-32.

Primary Examiner—James B. Mullins
Assistant Examiner—Steven J. Mottola
Attorney, Agent, or Firm—Holman & Stern

[57] ABSTRACT

The present invention relates to a feedforward-error-correction amplifier system comprising a switching circuit, a linear-amplification means, and a summing network, wherein an amplifier-system input signal is connected to a first input port of the linear-amplification means, and an output voltage signal produced at an output port of the linear-amplification means is fed to a first input port of the summing network, a signal which is a function of a current flowing in the output port of the linear-amplification means is fed to an input port of said switching circuit, said switching circuit having an output port at which a switching output signal is produced and which switching output signal is fed to another input port of the summing network, an output current flowing in the output port of the switching circuit having a time rate of change limited by a low-pass-filter means, a sensing signal which is a function of the switching output signal being fed to another input port of the linear-amplification means, the sensing signal being such that the output voltage signal is a function of distortion components in the switching output signal, and the summing network combines the switching output signal and the output voltage signal to produce a system output signal at a system output port, the system output signal being a function of the system input signal and said output port being adapted to have a load connected thereto, such that a current flowing in said load via said output port, when averaged over a period of time, is substantially provided by the switching circuit when said averaged output current is large.

15 Claims, 17 Drawing Figures

HIGH-EFFICIENCY FEEDFORWARD-ERROR-CORRECTION AMPLIFIER

This invention relates generally to amplifiers, and in particular audio power amplifiers, and the power amplifiers employed in inverters. The invention is specifically concerned with obtaining the attributes of both high efficiency and low distortion. With this invention it is possible to build high-performance amplifiers of low cost, small size, low weight and high reliability of operation. Other advantages are also achieved by the use of this invention.

In the prior art of amplifier technology it has been difficult to achieve high-efficiency operation simultaneously with low distortion. (In the context of the disclosure of this invention, low distortion occurs when the amplifier output closely approximates the desired output.) High efficiency means that there is little wasted power. High efficiency is desirable because minimal power is consumed, the electrical requirements of the associated power supply are minimal, and the hardware requirements for dissipating the wasted power are small. This leads to the attributes noted above. Low distortion is a necessary performance parameter of amplifiers in many practical applications.

In the prior art high-efficiency amplifiers have been of the switching type; the active power devices of these systems operate in a switching rather than a linear mode. Switching (also known as class-D) amplifiers may either be of the pulse-width-modulation type (see, for example: H. R. Camenzind, "Modulated pulse audio power amplifiers for integrated circuits", IEEE Trans. Audio Electroacoust., vol. AU-14, pp. 136-140, Sept. 1966; J. A. Dutra, "Digital amplifiers for analog power", IEEE Trans. Consumer Elec., vol. CE-24, pp. 308-316, Aug. 1978) or alternatively, of the self-oscillating type (see, for example: A. G. Bose, "Signal translation apparatus", British Pat. No. 1,055,788, Jan. 18, 1967; J. J. Spijkerman and C. L. Sturgeon, "The Sturgeon amplifier - a new switching technique", Proceedings of the Fourth National Solid-State Power Conversion Conference (Powercon 4), pp. H3-1–H3-3, May 1977). In this context the term pulse-width modulation is synonymous with driven or synchronous, and the term self oscillating is synonymous with free-running or ripple. Switching amplifiers have failed to become popular for high-fidelity audio applications for two reasons: their distortion is too high (and is not readily reduced by simply applying high levels of negative feedback) and their output contains considerable unwanted high-frequency (hf) energy. A further problem is their inferior large- and small-signal transient responses compared with those of their linear counterparts. It is an object of the present invention to ameliorate some or all of these defects of switching amplifiers.

Walker (see: P. J. Walker and M. P. Albinson, "Distortion-free amplifiers", U.S. Pat. No. 3,970,953, July 20, 1976) has shown how low distortion may be achieved in an audio power amplifier of conventional design by the application of feedforward error correction. Walker's amplifier does not possess high efficiency; it is an aim of the present invention to achieve both high efficiency and low distortion.

Vanderkooy (see: J. Vanderkooy and S. P. Lipshitz, "Feedforward error correction in power amplifiers", J. Audio Eng. Soc., vol. 28, pp. 2-16, Jan./Feb. 1980) has applied feedforward error correction to a switching amplifier to achieve high efficiency and low distortion. However, the configuration is unsatisfactory because its linear amplifier suffers from instability and saturation. Except under ideal circumstances which cannot be maintained in practice, the linear amplifier operates at considerably higher power than might otherwise be expected and efficiency is degraded.

The present invention combines low-efficiency linear circuits with high-efficiency switching circuits, such a combination being referred to here as a hybrid system. In the present invention the output signals of linear and switching circuits are summed together, both circuits supplying power in a parallel manner to a load and thus forming a parallel hybrid system. The efficiency of this system is high because the output current is predominantly supplied via the switching circuits; the linear circuit operates with low average output current. A different method of realising a hybrid system, a series hybrid system, is the subject of a previous invention (see: P. Garde, "High-efficiency low-distortion amplifier", Australian patent application No. 59694/80, June 26, 1980). In this previous method the outputs of switching circuits drive the supply rails of the output stage of a linear circuit thereby reducing the voltage across the output stage and achieving high efficiency. Power is supplied in a series manner from the switching circuits to the linear circuit and from there to the load. Both parallel and series hybrid systems have low distortion in their output signals because this depends upon their linear circuits, rather than their switching circuits alone; the linear circuits correct any error in the output of the switching circuits. As the linear circuits only operate at a power level sufficient to counteract the error in the output of the switching circuits, the power wasted by the linear circuits is very small compared with the power capability of the system, and high efficiency is obtained.

If very high efficiency is required, the parallel and series hybrid systems may be combined. In this scheme the linear circuit of a parallel hybrid system may itself be a series hybrid system. Alternatively, the linear circuit of a series hybrid system may be a parallel hybrid system. Similarly, more than two hybrid systems may be combined; however, such arrangements possess the disadvantage of high complexity.

The present invention consists in a high-efficiency feedforward-error-correction amplifier system comprising a high-efficiency switching circuit, a low-distortion linear-amplification means, and a summing network, wherein an amplifier-system input signal is connected to a first input port of the linear-amplification means, and an output voltage signal produced at an output port of the linear-amplification means is fed to a first input port of the summing network, a signal which is a function of a current flowing in the output port of the linear-amplification means is fed to an input port of said switching circuit, said switching circuit having an output port at which a switching output signal is produced and which switching output signal is fed to another input port of the summing network, an output current flowing in the output port of the switching circuit having a time rate of change limited by a low-pass-filter means, a sensing signal which is a function of the switching output signal being fed to another input port of the linear-amplification means, the sensing signal being such that the output voltage signal is a function of distortion components in the switching output signal, and the summing network combines the switching output signal and the output voltage signal to produce a system output signal at a system output port, the system output signal being a function of the system input signal and having a low level of distortion, and said output port being adapted to have a load connected thereto, such that a current flowing in said load via said output port, when averaged over a period of time, is substantially provided by the switching circuit when said averaged output current is large.

In particular embodiments of the present invention, the time rate of change of the switching-circuit output current is limited by a low-pass-filter means disposed between the switching circuit output port and the summing-network input port. In other embodiments this low-pass-filter means is incorporated into the summing network, while in still other embodiments two low-pass-filter means can be provided, one incorporated into the summing network and the other disposed between the switching-circuit output port and the summing-network input port.

Embodiments of the present invention can also include additional low-pass-filter means incorporated into the output of the summing network.

In particular embodiments of the present invention the transfer function of the linear-amplification means is independent of frequency over the useful frequency range of the amplifier system and the sensing signal is produced by passing the switching output signal through a low-pass filter. Other embodiments can incorporate an integrating function in the linear-amplification means, in which case the sensing signal is arranged to be proportional to the switching output signal.

In embodiments of the present invention additional filter means can also be incorporated into at least one of the inputs of the linear-amplification means.

In particular embodiments of the present invention a plurality of switching circuits can be provided in parallel connection, the switching output signal of each switching circuit being fed to an input port of the summing network the number of summing network input ports provided for the switching circuits being less than or equal to the number of switching circuits, and the maximum time rate of change of the output current flowing in the output port of each switching circuit being limited by low-pass-filter means.

It will be apparent to those skilled in the art that there are many different techniques for realising the present invention and that embodiments may be produced with many different features, the choice of those features for a particular application being dependent upon the use to which the system is to be put. Some of these techniques and features will now be discussed by way of example; however, it is not intended that the invention be limited to these examples.

Embodiments of the present invention may include a low-pass filter within the linear circuit at the input signal terminals. This filter attenuates any hf noise such as that which originates from hf signal sources or switching of electric currents.

The peak-current capability of the linear circuit of particular embodiments of the present invention may be of almost any value, high or low, in any given application. In all cases the average power dissipated by the linear circuit can be low and thus high efficiency achieved. The advantage of a high-current capability is that the switching circuits and associated networks can have a slow response. A slow network response infers that the network greatly attenuates the switching transients. In this case it is easy to keep the switching frequency low, thus minimising switching losses. Under transient or other input signal conditions which are too fast for the switching circuits and associated networks, the distortion is kept low by high currents supplied by the linear circuit. As transients form only a small proportion of the input signal in most practical applications, such as in audio systems, these high currents do not add significantly to the average power dissipated by the linear circuits.

If the linear circuit is designed with a low-peak-current capability, the cost of the linear circuit is low; the linear circuit may be a low-power integrated-circuit amplifier. In this case, if the system is to respond linearly to fast signals, the response of the switching circuits and associated networks must also be fast. A problem with conventional power amplifiers of the prior art is the difficulty of stabilising the bias current of the output devices. The problem is particularly severe with high-power amplifiers. The present invention substantially eases the difficulty because the linear circuit of a high-power amplifier need only have low-power capability. For the same reason the problem of secondary breakdown in the output transistors of a high-power amplifier is also greatly reduced. In addition, it is simple to fabricate a very fast linear circuit when its output requirement is low. The advantage of a fast linear circuit is that a large amount of negative feedback can be employed and very low distortion achieved.

The performance of particular embodiments of the present invention is critically dependent on the amplitude equality and opposed phase of the transfer function of the linear circuit with respect to that linear-circuit input associated with sensing the switching-circuit output, and the ratio by which the summing network weights the switching-circuit output to the linear-circuit output. It is therefore desirable that the linear-circuit transfer function be stabilised by the use of negative feedback. The linear circuit may include more than one negative-feedback loop. In particular, the use of multiple feedback loops around the linear-circuit output stage may substantially improve the accuracy of the error-correction signal and minimise system distortion.

Within the switching circuit the control signals of the switching devices may be derived so that the circuit operates in either pulse-width-modulation or self-oscillating mode; several other modes of operation are also possible.

Dc isolation between the power source and the input and output terminals of an amplifier is a requirement in many applications of the present invention. The switching circuits of particular embodiments of the present invention may be designed so that they inherently possess dc isolation. In this case the use of a large heavy mains-frequency power transformer or an hf switching supply to power the system are avoided.

It is the requirement of the present invention to limit the time rate of change of the output currents of the switching circuits. This may be achieved by including inductance in series with the switching-circuit outputs. Summing-network components may be inductive. Alternatively, inductance may be placed prior to the summing network within low-pass filters, or included in both the summing network and the low-pass filters. The maximum time rate of change of the currents is a strong function of the difference between the switching-current supply voltage and the system output voltage. To avoid unduly limiting the large-signal (power) bandwidth of the system when driving a load it may be desirable for the switching circuits to be connected to higher supply voltages than those which power the linear circuit.

Optional low-pass filters, having cut-off frequencies which are usually higher than the large-signal bandwidth of the system, may be connected between the switching circuits and the summing network, and may have one or more LC sections to attenuate the hf error components from the switching circuits. This reduces the hf amplitude of the error-correction signal of the output of the linear circuit and thereby improves the distortion performance of the system.

The average switching frequency may be reduced and switching losses minimised if the supply voltage of the switching circuit is varied as a function of the load voltage and of the time rate of change of the load current. Continuous or discrete-level supply-voltage variation is possible. For example, a selection of discrete voltages may be available to power the switching circuits, the most appropriate voltage at any instant in time being fed to the switching circuits by suitable logic circuitry.

The average switching frequency may also be reduced and switching losses minimised if two or more switching circuits and associated networks are operated in parallel. The various switching circuits and their associated networks may or may not be of different design and thus may switch at different switching-circuit input levels and have different response speeds. When a fast response is required more than one switching circuit may turn on to supply the output, or alternatively, a single switching circuit and associated network with an appropriately fast response may supply the output. The switching circuits may be powered from the same or different supply voltages.

If two or more switching circuits and associated networks operate in parallel, means may be provided so that when the load current is high the current is shared between the circuits according to their capabilities.

Embodiments of the present invention may include a negative-feedback loop which encloses the summing network and the linear circuit. Although such a loop is not always desirable it may be effective when the system is built with wide-tolerance components, for example.

Embodiments of the present invention may include a low-pass filter immediately following the summing network. Such a filter attenuates the hf noise fed to the load and decouples the load from the system; the effect of the hf impedance of the load on system performance is minimised. For maximum attenuation of the noise the cut-off frequency of the filter must be as low as possible, the limiting frequency being set by the required large-signal bandwidth of the system. This is usually considerably below the required small-signal bandwidth (cut-off frequency) of the system.

If the filter cut-off frequency is to be below the system small-signal bandwidth then the filter characteristic must be equalised elsewhere in the system. Exact equalisation is often difficult to achieve, particularly if the load impedance is not well defined. To avoid this difficulty the filter may be enclosed in a negative-feedback loop. Provided that the loop has sufficient gain, the desired system small-signal bandwidth can be attained. The negative-feedback loop enclosing the filter may or may not be the only loop enclosing the linear circuit.

When a feedback loop encloses the filter the load is an integral part of the negative-feedback loop at high frequencies. It may therefore be desirable to decouple the load at such frequencies with another low-pass filter.

Embodiments of the present invention may include special circuitry to protect the system from failure such as is possible during signal overdrive, overload conditions, or high-temperature operation.

The present invention will now be described more fully, by way of example only, with reference to preferred embodiments as shown in the accompanying drawings, and in which:

FIGS. 4(a) through 4(d) are diagrams showing examples of voltage waveforms $v_a$ and $v_b$ of a pulse-width-modulator switching circuit as a function of time;

Figure 1A:
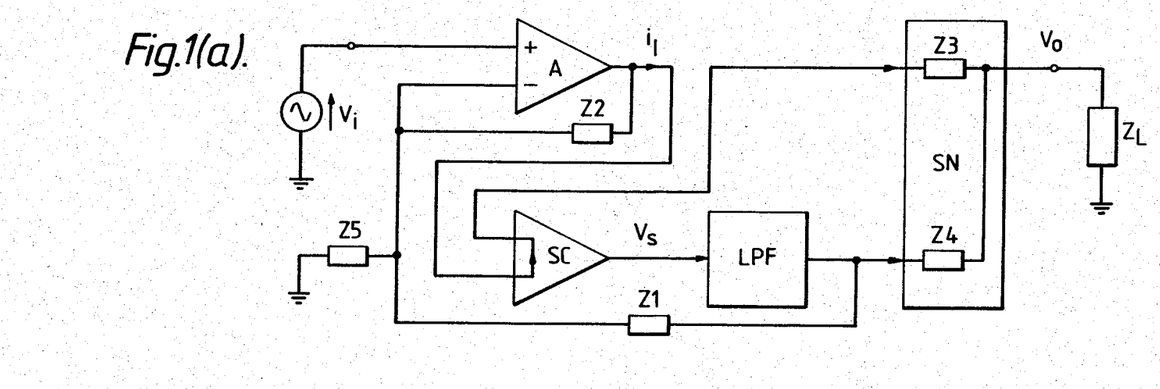
FIGS. 1(a) and 1(b) are partial schematics of two embodiments of the invention.
Figure 1B:
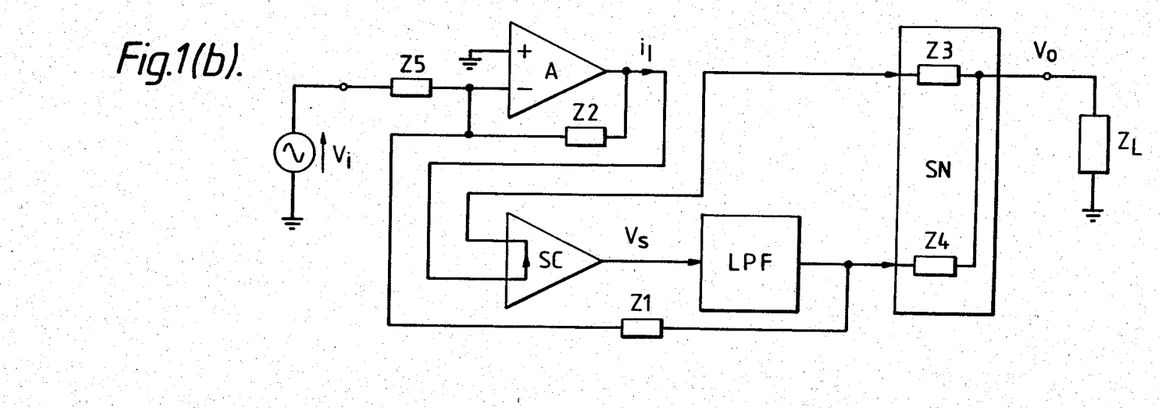

Two embodiments of the high-efficiency feedforward-error-correction amplifier of the present invention are depicted in FIG. 1: a noninverting amplifier is shown in FIG. 1(a) and an inverting amplifier in FIG. 1(b). In these embodiments the amplifier system is driven by the input signal source $v_i$. The linear circuit consists of the operational amplifier A, and the impedances Z1, Z2, and Z5 which control the linear-circuit transfer functions. The linear circuit drives the load $Z_L$ via the summing network SN which consists of impedances Z3 and Z4. The input signal to the switching circuit SC is the linear-circuit output current $i_1$, or any other signal that is a function of that current. The switching current drives the load via the optional low-pass filter LPF and the summing network. The impedance Z1 senses the signal supplied to the load by the switching circuit. The linear circuit amplifies the difference between that signal and the desired no-error value which occurs when both inputs to the summing network have the same voltage. The linear circuit also amplifies the system input signal. The linear circuit inverts the signal from the switching circuit so that the correction signal at the linear-circuit output is of opposite polarity to the error in the switching-circuit output. The correction signal and the error signal therefore cancel at the output of the summing network. The cancellation is complete if the transfer function of the linear circuit with respect to that linear-circuit input associated with impedance Z1 equals, but is of opposed phase to, the ratio by which the summing network weights the switching-circuit output to the linear-circuit output. The output signal $v_o$ has low distortion if this error-cancellation requirement is met. It is apparent from FIG. 1 that the cancellation requirement is approximately given by the equality $Z2/Z1=Z3/Z4$. The equality assumes that the operational amplifier has ideal characteristics. In practice one important consideration is the finite gain of the operational amplifier which results in a small voltage between its input terminals. Provided that the system input signal level is such that the switching circuit changes state, this voltage is a nonlinear function of the signal level even if the operational amplifier is truly linear. Therefore, if very low distortion is to be attained, the equality must account for the finite gain of a practical operational amplifier. Unfortunately, the wide tolerance on the open-loop transfer function of a practical operational amplifier and its nonlinear behaviour, the tolerance on the system component values, and the practical difficulty of realising complex impedances make it impossible to actually achieve zero distortion.

Figure 2:
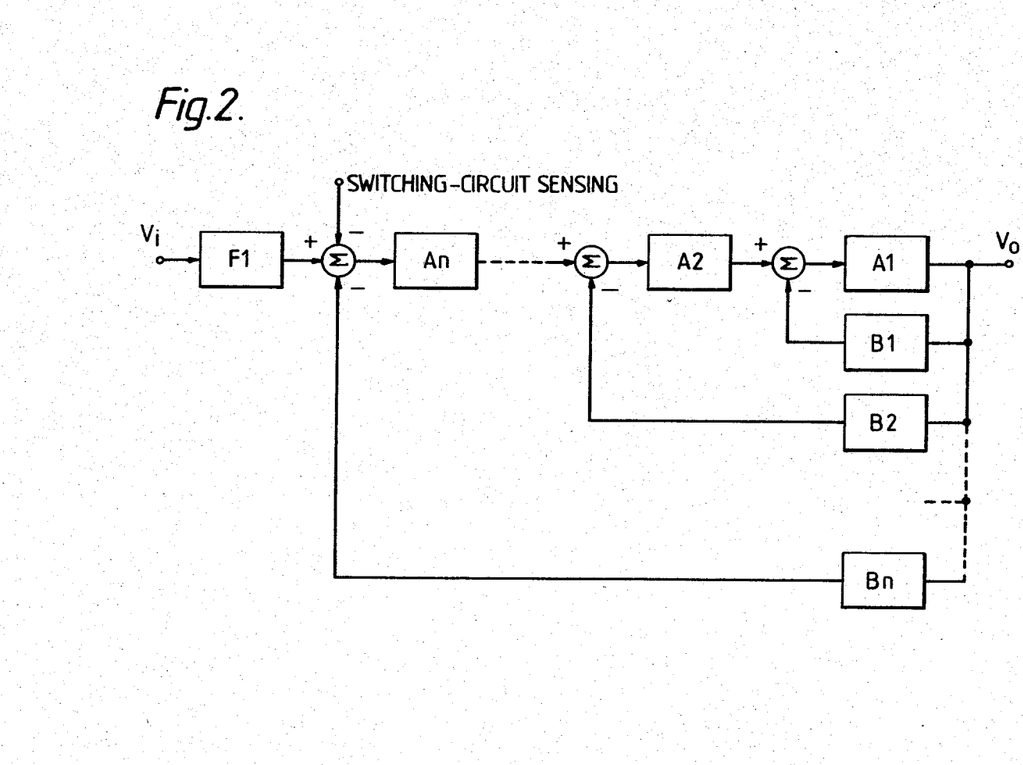
FIG. 2 is a block diagram of a linear circuit utilising multi-loop negative feedback and an input filter.

While the linear circuit used in embodiments of the present invention may be a linear amplifier of conventional design, it is nevertheless advantageous if it utilises negative feedback to stabilise the linear-circuit transfer function, as shown in FIG. 1 for example. The linear circuit may have more than one negative-feedback loop. In addition, when very low distortion is required the operational amplifier within the linear circuit may be specially designed to have a narrow tolerance on its open-loop transfer function. This may be achieved by the use of local or nested feedback loops around each amplifier stage. It is thus possible to accurately account for the finite open-loop gain of the operational amplifier in the error-cancellation requirement. One example of such a design, a multi-loop negative-feedback linear circuit with an input filter, is shown in FIG. 2. The low-pass filter F1 at the input attenuates hf noise entering the system input terminals. In the forward path of the circuit there are n amplifying stages A1 to An. The state An should employ a local feedback loop. The feedback networks B1 to Bn complete the n loops which enclose the output stage of the amplifier. In this arrangement the total loop gain around the stage may be very high, well in excess of Bode's limit for a single feedback loop, so the distortion is reduced to a low level. The arrangement must be carefully designed to avoid oscillation; design procedures are well known to those skilled in the art.

Embodiments of the present invention may have a linear circuit that supplies either uni- or bi-directional current. The advantage of a system whose linear-circuit current is uni-directional may be simple implementation. The advantage of a bi-directional linear-circuit current may be very high efficiency. The nature of the linear-circuit current is determined by the design of the switching circuits and associated networks.

There is considerable freedom in the biasing arrangements of a linear-circuit output stage of a system which supplies bi-directional current; class-A, -B, or -AB biasing is possible, for example. When a linear circuit which supplies uni-directional current is used, a novel class-A arrangement may be employed wherein the output stage is single ended with the bias current supplied by the switching circuits, via the associated networks.

Figure 3:
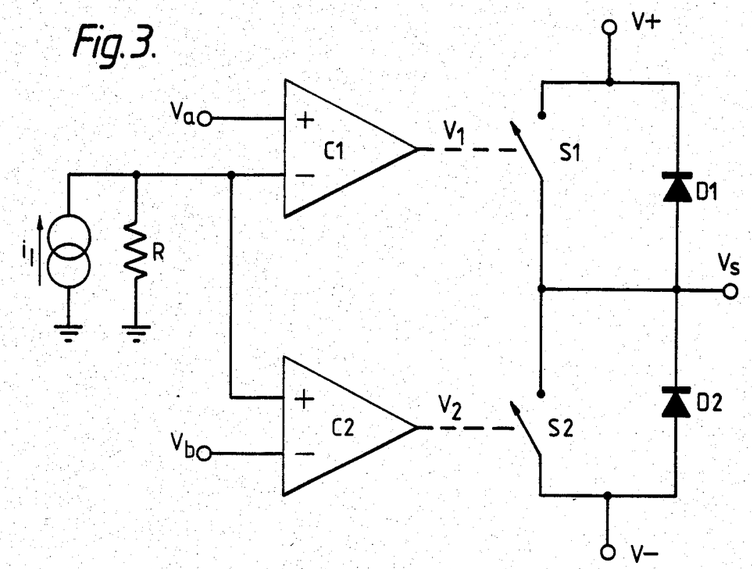
FIG. 3 is a partial schematic of a pulse-width-modulator switching circuit.

There are many ways of implementing the switching circuit; operation may be based upon pulse-width-modulation or self-oscillating principles, for example. The partial schematic of one arrangement for implementing a pulse-width-modulator switching circuit is shown in FIG. 3. The comparators C1 and C2 compare a voltage proportional to the linear-circuit output current with two oscillatory waveforms $v_a$ and $v_b$ which may have appreciable dc components. The comparator outputs $v_1$ and $v_2$, operate two switches S1 and S2, a high output voltage causing a switch to open. The clamp diodes D1 and D2 avoid extreme voltage swings of the switching-circuit output when its load is inductive.

Figure 4A:
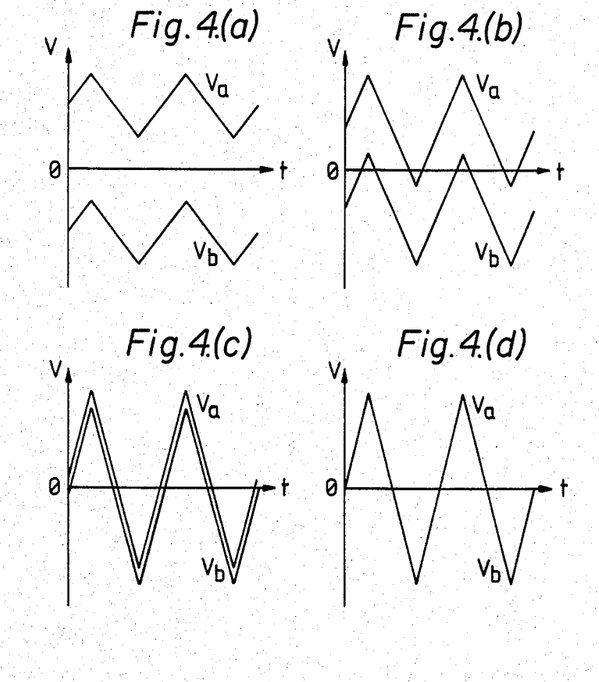

Examples of voltage waveforms suitable for $v_a$ and $v_b$ when the linear circuit supplies bi-directional current are shown as a function of time t in FIG. 4. Although the waveforms are triangular many other waveform shapes are equally suitable. However, for proper operation it is desirable that $v_a$ should always be more positive than $v_b$ at any instant. In the first example FIG. 4(a), there is no output from the switching circuit at low input-signal levels and the linear circuit alone drives the output. This feature avoids switching noise and distortion at low signal level. In the second example FIG. 4(b), switching occurs at all signal levels. In the third example FIG. 4(c), the waveforms $v_a$ and $v_b$ are almost identical. If the waveforms are identical as shown in FIG. 4(d), either S1 or S2 is closed at any given instant and therefore D1 and D2 are redundant. The disadvantage of identical waveforms is that non-ideal behaviour of the switches may cause their conduction periods to overlap and result in current flow between the supply rails V+ and V−. By slightly offsetting the waveforms as shown in FIG. 4(c), this problem is avoided. While it is unnecessary that $v_a$ and $v_b$ be in phase, this is nevertheless desirable if $v_a$ is to be always more positive than $v_b$. In addition, when $v_a$ and $v_b$ are in phase the least time that switches S1 and S2 are both off is maximised, and conduction overlap is most unlikely.

If the switching circuit operates in the self-oscillating mode then it is unnecessary to generate two oscillatory waveforms. The partial schematic of FIG. 3 is also suitable for implementing a self-oscillating switching circuit if $v_a$ and $v_b$ are dc voltages and if comparators C1 and C2 have appreciable hysteresis.

Figure 5:
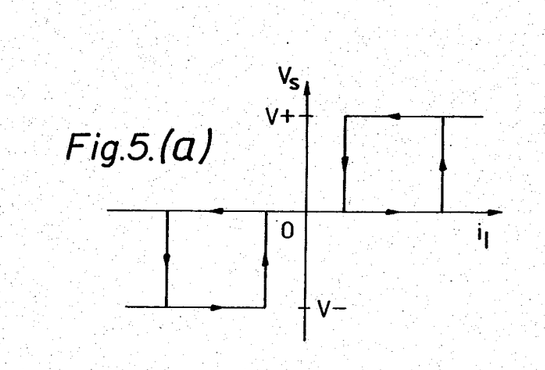
FIGS. 5(a) through 5(d) are diagrams showing examples of transfer characteristics of a self-oscillating switching circuit when driving a resistive load.

Examples of the transfer characteristics of a self-oscillating switching circuit driving a resistive load, when the associated linear circuit supplies bi-directional current, are shown in FIG. 5. In the first example FIG. 5(a), switch S1 closes when the linear-circuit output current is sufficiently large. When the current subsequently reduces to a low value, switch S1 opens. Switch S2 closes when the current is large and negative, and it opens when the current becomes small. At low input-signal levels there is no output from the switching circuit and in this situation, as with the scheme associated with FIG. 4(a), switching noise and distortion are avoided. In the second example FIG. 5(b), switching occurs at all signal levels. In the third example FIG. 5(c), the magnitudes of the currents at which the switches open and close are almost equal. If the current magnitudes are equal as shown in FIG. 5(d), the transfer characteristic degenerates into a single hysteresis loop. In this case either S1 or S2 is closed at any given instant and therefore D1 and D2 are redundant. The disadvantage of this type of operation is that conduction overlap of the switches may result in current flow between the supply rails. By making the current magnitudes unequal as shown in FIG. 5(c), this problem is avoided.

In a particular application it may be advantageous if the switching-circuit voltages $v_a$ and $v_b$ are a function of the system operating conditions. For example, if the magnitudes of $v_a$ and $v_b$ decrease as temperature increases, the power dissipated by the linear circuit reduces and stress on the linear circuit is relieved.

Embodiments of the present invention may be designed so that they possess dc isolation between the power source and the system terminals by including an hf transformer within the switching circuit; additional isolation devices may also be required. Methods of embedding an hf transformer within a switching circuit are well known (see, for example: L. Rensink et al., "Design of a kilowatt off-line switcher using a Cuk converter", Proceedings of the Sixth National Solid-State Power Conversion Conference (Powercon 6), pp. H3-1–H3-26, May 1979; S. Cuk, "A new zero-ripple switching dc-to-dc converter and integrated magnetics", IEEE Power Electronics Specialists Conference, 1980 Record, pp. 12–32). The linear circuit may be powered from a low-power auxiliary supply. Thus dc isolation between the power source and the system terminals is readily achieved without the disadvantages or a large heavy mains-frequency transformer.

Figure 6:
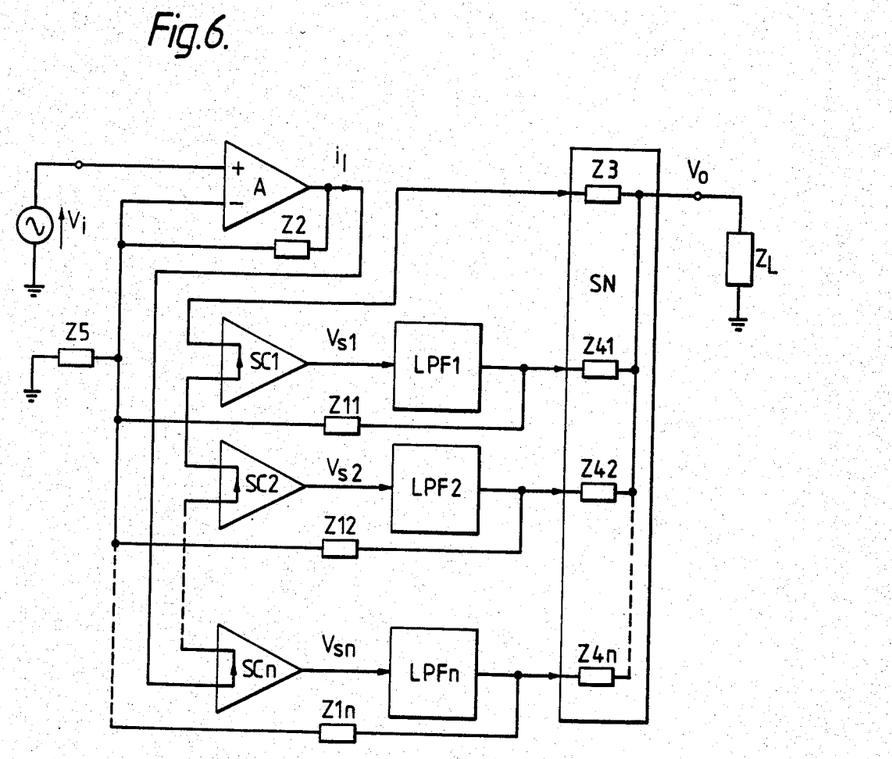
FIG. 6 is a partial schematic of an embodiment of the invention incorporating multiple switching circuits.

Embodiments of the present invention may have multiple switching circuits and associated networks operating in parallel. One possible arrangement of a noninverting amplifier is shown in FIG. 6. The input to each of the switching circuits SC1 to SCn is the linear-circuit output current $i_1$. The output signals from the low-pass filters LPF1 to LPFn associated with the switching circuits are added to that from the linear circuit by the summing network SN.

Figure 7:
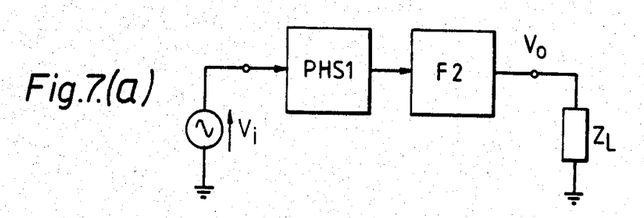
FIGS. 7(a) through 7(c) are block diagrams of an embodiment of the invention incorporating various output filtering arrangements.

Embodiments of the present invention may include various filters connected at the output of the amplifier system as shown in FIG. 7. In FIG. 7(a) a low-pass filter F2 is connected in series with the output of the parallel hybrid system PHS1. In FIG. 7(b) the low-pass filter F3 is enclosed in a negative-feedback loop. In FIG. 7(c) the load is decoupled by filter F5 from the negative-feedback loop enclosing filter F4.

Figure 8:
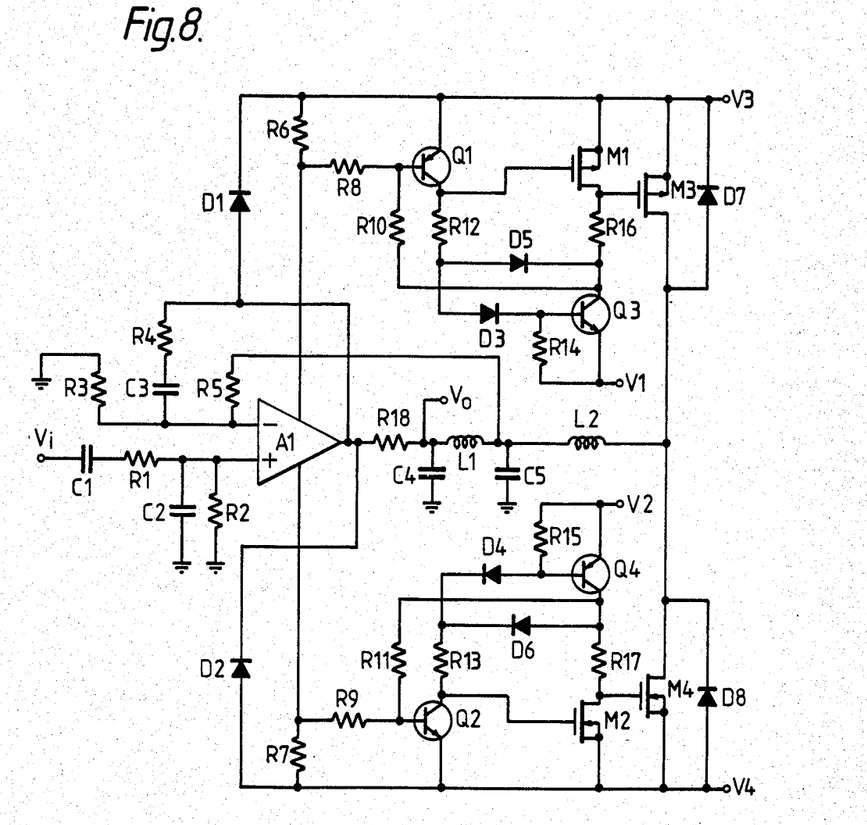
FIG. 8 is a circuit diagram of an audio power amplifier which is an embodiment of the invention.

The circuit diagram of an audio power amplifier which is an embodiment of the invention is shown in FIG. 8. The amplifier has an input signal $v_i$ which is ac coupled via capacitor C1 to a low-pass filter composed of capacitor C2, and resistors R1 and R2. The filtered signal passes to the positive input of operational amplifier A1. This amplifier is powered from a positive voltage source V3 and a negative voltage source V4 via resistors R6 and R7. These resistors sense the operational amplifier output current. When the output current is low, bipolar transistors Q1 and Q2 are both off, but if the current increases sufficiently either Q1 or Q2 turns on. If Q1 turns on, transistor Q3 also turns on and MOS transistor M1 turns off. This turns MOS transistor M3 on and current from V3 is supplied via the low-pass filter (comprising capacitor C5, and inductor L2) to the summing network composed of inductor L1, and resistor R18, and loaded by capacitor C4. The inductors limit the time rate of change of the current supplied by the switching network to the power-amplifier output whose signal voltage is $v_o$. As the current in M3 increases, the current in R6 becomes small, and hence M3 is eventually switched off. When M3 turns off, diode D8 limits the voltage swing at the drain of M3 to a safe value and maintains current flow in L2. Resistors R8 and R10 provide hysteresis in the transfer characteristic. The collector current of Q1 is set by R12 and the voltage source V1 whose potential is less than V3. Diodes D3 and D5 avoid saturation of Q3. Resistor R16 limits the peak current in Q3 to a safe value. It is apparent from symmetry that M2, M4, Q2, Q4, and the associated circuitry function in a similar manner to M1, M3, Q1, Q3, and their associated circuitry as just described, although with currents and voltages of opposite polarity. Therefore, this section of the amplifier is not considered further. Resistor R3 in conjunction with R5 sets the gain of the amplifier (the gain is also slightly dependent on R1 and R2). Capacitor C3 and resistor R4 provide negative feedback around A1 and define its closed-loop transfer function; R4 helps compensate for the effect of a finite loop gain. Resistor R5 senses the switching-circuit output signal to enable derivation of the error-correction signal. Diodes D1 and D2 protect the output of A1 from any excessive voltage swing.

I claim:

1. A high-efficiency feedforward-error-correction amplifier system comprising a high-efficiency switching circuit having a control input and an output, a low-distortion linear-amplification means having an input and an output, a summing network having a plurality of inputs, and a system output port, wherein a system input signal is fed to the input of the linear-amplification means, and an output voltage signal produced at the output of the linear-amplification means is fed to one input of the summing network, a signal which is a function of a current flowing in the output of the linear-amplification means is used to control the switching circuit via the control input and a switching output signal is produced at the output of the switching circuit and is fed to another input of the summing network, an output current flowing in the output of the switching circuit having a time rate of change limited by a low-pass-filter means, a sensing signal which is a function of the switching output signal being fed to the input of the linear-amplification means, the sensing signal being such that the output voltage signal is a function of distortion components in the switching output signal, and the summing network combines the switching output signal and the output voltage signal to produce a system output signal at the system output port, the system output signal being a function of the system input signal and having a low level of distortion, and said output port being adapted to have a load connected thereto, such that a current flowing in said load via said output port, when averaged over a period of time, is substantially provided by the switching circuit when said averaged output current is large.

2. An amplifier system as claimed in claim 1, wherein said linear-amplification means incorporates a negative-feedback loop.

3. An amplifier system as claimed in claim 1, wherein said linear-amplification means incorporates multiple feedback loops.

4. An amplifier system as claimed in claim 1, wherein said linear-amplification means incorporates filter means to attenuate undesirable signals entering the input of the linear-amplification means.

5. An amplifier system as claimed in claim 1, wherein said switching circuit incorporates hysteresis in its transfer characteristic.

6. An amplifier system as claimed in claim 1, wherein a plurality of switching circuits are provided in parallel connection, the switching output signal of each switching circuit being fed to an input of the summing network, the number of summing-network inputs provided for the switching circuits being equal to the number of switching circuits, and the maximum time rate of change of the output current flowing in the output of each switching circuit being limited by low-pass-filter means.

7. Am amplifier system as claimed in claim 1, wherein said low-pass-filter means is disposed between said switching-circuit output and said summing-network input.

8. An amplifier system as claimed in claim 6, wherein said low-pass-filter means associated with one switching-circuit output is disposed between said switching-circuit output and its respective summing-network input.

9. An amplifier system as claimed in claim 1, wherein said low-pass-filter means is incorporated into said summing network.

10. An amplifier system as claimed in claim 6, wherein said low-pass-filter means associated with one switching-circuit output is incorporated into its respective summing-network input.

11. An amplifier system as claimed in claim 1, wherein said low-pass-filter means comprises two sections, one of which is disposed between said switching-circuit output and said summing-network input, and the other of which is incorporated into said summing network.

12. An amplifier system as claimed in claim 6, wherein said low-pass-filter means associated with one switching-circuit output comprises two sections, one of which is disposed between said switching-circuit output and its respective summing-network input, and the other of which is incorporated into its respective summing-network input.

13. An amplifier system as claimed in claim 1, wherein additional filter means is incorporated into the output of said summing network.

14. An amplifier system as claimed in claim 13, wherein the additional filter means and the linear-amplification means share a common negative feedback loop.

15. An amplifier system as claimed in claim 1, wherein two additional filter means are incorporated into the output of said summing network, one additional filter means and the linear-amplification means sharing a common negative-feedback loop.

* * * * *